(12) United States Patent
Hauser et al.

(10) Patent No.: US 8,354,673 B2
(45) Date of Patent: Jan. 15, 2013

(54) SEMICONDUCTOR COMPONENT

(75) Inventors: Otto Hauser, Esslingen (DE); Hartmut Frey, Esslingen (DE)

(73) Assignee: Dritte Patentportfolio Beteiligungsgesellschaft mbH & Co. KG, Schönefeld/Waltersdorf (DE)

( * ) Notice: Subject to any disclaimer, the term of this patent is extended or adjusted under 35 U.S.C. 154(b) by 327 days.

(21) Appl. No.: 12/738,526

(22) PCT Filed: Jul. 29, 2008

(86) PCT No.: PCT/EP2008/006239
§ 371 (c)(1),
(2), (4) Date: Apr. 16, 2010

(87) PCT Pub. No.: WO2009/052878
PCT Pub. Date: Apr. 30, 2009

(65) Prior Publication Data
US 2010/0213465 A1    Aug. 26, 2010

(30) Foreign Application Priority Data
Oct. 18, 2007 (DE) .......................... 10 2007 050 288

(51) Int. Cl.
*H01L 29/38* (2006.01)
*H01L 21/208* (2006.01)
*H01L 21/00* (2006.01)

(52) U.S. Cl. ........... 257/64; 257/E29.105; 257/E21.114; 257/E21.52; 257/E21.09; 438/488

(58) Field of Classification Search .................. None
See application file for complete search history.

(56) References Cited

U.S. PATENT DOCUMENTS

| | | | | |
|---|---|---|---|---|
| 4,394,529 A * | 7/1983 | Gounder | ........................ | 136/245 |
| 4,686,322 A * | 8/1987 | Kujas | .............................. | 136/245 |
| 6,086,945 A * | 7/2000 | Kamata et al. | ................... | 427/74 |
| 2002/0098671 A1 | 7/2002 | Cheong | | |

FOREIGN PATENT DOCUMENTS

| | | |
|---|---|---|
| EP | 1 551 057 A1 | 7/2005 |
| EP | 1551057 A1 * | 7/2005 |
| JP | 60-079780 A | 5/1985 |
| WO | 2004/084282 A1 | 9/2004 |

OTHER PUBLICATIONS

Kuraseko, H.; Nakamura, T.; Toda, S.; Koaizawa, H.; Jia, H.; Kondo, M.; , "Development of flexible fiber-type poly-Si solar cell," Photovoltaic Energy Conversion, Conference Record of the 2006 IEEE 4th World Conference on , vol. 2, No., pp. 1380-1383, May 2006.*

Chopra, K. L., P. D. Paulson, and V. Dutta. "Thin-film Solar Cells: An Overview." Progress in Photovoltaics: Research and Applications 12.23 (2004): 69-92.*

(Continued)

*Primary Examiner* — Thomas L Dickey
*Assistant Examiner* — Joseph Schoenholtz
(74) *Attorney, Agent, or Firm* — Panitch Schwarze Belisario & Nadel LLP

(57) ABSTRACT

A semiconductor component is provided having a substrate and at least one semiconductor layer realized to be polycrystalline on one side of the substrate. The polycrystalline semiconductor layer contains the crystal nuclei.

22 Claims, 3 Drawing Sheets

OTHER PUBLICATIONS

T. Schlenker, K. Orgassa, H. W. Schock and J. H. Werner (2003). Nucleation of Cu(In, Ga)Se2 on Molybdenum Substrates. MRS Proceedings, 763 , B8.7.*

Rand, J.A.; Cotter, J.E.; Thomas, C.J.; Ingram, A.E.; Bai, Y.B.; Ruffins, T.R.; Barnett, A.M, "Silicon on graphite cloth," Photovoltaic Energy Conversion, 1994., Conference Record of the Twenty Fourth. IEEE Photovoltaic Specialists Conference—1994, 1994 IEEE First World Conference on , vol. 2, No., pp. 1262-1265 vol. 2, Dec. 5-9, 1994.*

Kim, Dong Seop, Shi Yul Kim, BYung Tae Ahn, and Ho Bin Im. "Effects of Morphologies of (Cd+Te) Powders on the Properties of Sintered CdS/CdTe Solar Cells." Journal of Materials Science: Materials in Electronics 5.1 (1994): 17-21.*

K.L. Chopra, et al., "Thin-Film Solar Cells: An Overview"; Progress in Photovoltaics: Research and Applications; vol. 12; pp. 69-92; (2004).

G. Beaucarne et al.; "Thin-film polysilicon solar cells on foreign substrates using direct thermal CVD: material and solar cell design"; Thin Solid films 403-404; pp. 229-237; (2002).

Office Action issued Sep. 15, 2011 in CN Application No. 200880112273.8.

J.A. Rand et al., "Silicon on Graphite Cloth," First WCPEC, IEEE, pp. 1262-1265 (1994).

Office Action issued Sep. 24, 2010 in EP Application No. 08785186.1.

English translation of Intl'l Prelminary Report on Patentability issued on Aug. 2, 2010 in Int'l Application No. PCT/EP2008/006239.

* cited by examiner

SEMICONDUCTOR COMPONENT

CROSS-REFERENCE TO RELATED APPLICATIONS

This application is a Section 371 of International Application No. PCT/EP2008/006239, filed Jul. 29, 2008, which was published in the German language on Apr. 30, 2009, under International Publication No. WO 2009/052878 A1 and the disclosure of which is incorporated herein by reference.

BACKGROUND OF THE INVENTION

As much as the demand for electronic devices increases, the demand for semiconductor components increases as well. These include the basic components or wafers from which integrated circuits or single component parts are manufactured, as well as solar cells for obtaining current from light.

In the production, crystal layers of a semiconductor material have to date been grown on a substrate, for example by epitaxy. This production method is time-consuming and, as a rule, has to be carried out under vacuum.

BRIEF SUMMARY OF THE INVENTION

Starting from this, the object of the invention is to create a novel component, in which the polycrystalline semiconductor layers may be industrially produced in a simpler manner.

Moreover, it is an object of the invention to create a suitable production method for the inventive component.

According to the invention, this object is achieved by a component having a substrate which comprises a surface and having at least one polycrystalline layer of a semiconductor material on at least a part of the surface, wherein the polycrystalline layer contains a plurality of diffusely distributed crystal nuclei.

The object is further achieved by a method for producing a component of the above type, wherein a suspension is applied to the substrate which is composed of crystal nuclei and a fluid in the form of a liquid or a gas, which keeps the semiconductor material chemically bound, and wherein the formed layer is thermally treated after application of the suspension to the substrate in order to obtain the polycrystalline layer.

The component comprises a substrate having a surface. A polycrystalline layer of a semiconductor material is provided on at least a part of the surface. The polycrystalline layer contains a plurality of diffusely distributed crystal nuclei. Hereby, a rapid crystallization is achieved while the diffusely distributed crystal nuclei do not affect the electrical property of the polycrystalline layer.

The substrate may preferably consist of a material that is dimensionally stable at temperatures of between 800° C. and 900° C. This temperature range is advantageous since crystallization within this temperature range proceeds faster in the vicinity of the crystal nuclei until the entire applied coating is completely crystallized. This process is relatively fast since the crystal nuclei are diffusely distributed in the entire applied mass in a uniform manner. This temperature is further advantageous because the semiconductor donor dissociates thermally and releases the semiconductor material atomically.

With the novel component, the application of the semiconductor layer is not required to be performed under vacuum, rather a protective gas atmosphere is sufficient.

Suitable materials for the substrate may be stainless steel (nickel-chromium steel), glass or carbon or comparable materials.

The substrate may be plate-shaped or film-shaped. It may also be formed of a textile sheet material or have a linear shape.

Depending on the material of the substrate, it is appropriate to implement a diffusion barrier layer between the substrate and the first layer of polycrystalline semiconductor material. For this purpose, molybdenum is an option for the material.

The base material for the polycrystalline semiconductor layer may be a substance which is suited as a donor for the semiconductor material, for instance a liquid or gaseous silane when silicon semiconductor layers are concerned, or germane when the layer is to be polycrystalline germanium.

The polycrystalline semiconductor layer may incidentally be further realized to be p-conducting or n-conducting by the corresponding doping atoms.

The crystal nuclei may comprise the same material as the main constituent of the polycrystalline semiconductor layer, hence for instance silicon in the case of a silicon layer, or even of another material acting as a seed crystal for the desired material. Germanium could also be an option here.

The component may also contain several layers of polycrystalline semiconductor material stacked upon one another. Large-surface semiconductor components may be created in this manner, for example photodiodes of a corresponding size suited as solar cells. The semiconductor layers are applied one after the other according to the same procedure and consequently have the same nanostructure.

In this case, the one layer is doped to be p-conducting and the other layer to be n-conducting in order to generate the required p-n junction.

On that side of the semiconductor layer facing away from the substrate and which is farthest from the substrate, the component may be provided with a layer which is intrinsically conducting or metallically conducting.

In the application of the component as a solar cell, it is for example appropriate for the substrate to be coated on both sides in the manner of a photodiode/photoelement. When in use, one side receives direct sunlight, whereas the other side receives the diffuse light from the environment, whereby the efficiency is increased as a whole.

The thickness of the crystal nuclei is in the order of 100 to 100,000 particles per $mm^3$ of the semiconductor layer, depending on the particle size.

According to a further aspect of the invention, the object as stated above consists in proposing a method for producing the inventive component.

The method provides for an aerosol or a suspension composed of crystal nuclei and a fluid in the form of a liquid or a gas to be applied onto the substrate. The desired semiconductor material is chemically bonded within the fluid. After the application of the aerosol or the emulsion onto the substrate, the formed layer is thermally treated to generate the polycrystalline layer. During this process, the chemical substance which contains the semiconductor material is caused to release the semiconductor material in atomic form so that it can deposit around the crystal nuclei in crystalline form.

Silanes or germanes from which silicon/germanium can be released as an atom for crystallization are suitable as the fluids in gaseous or liquid form.

The crystal nuclei may have a size of between 100 nm and 10,000 nm, preferably 500 nm and 2000 nm, more preferably between 700 nm and 1400 nm.

Any material which is dimensionally stable enough at the required crystallization temperature is conceivable as the material for the substrate. Examples of suitable materials are stainless steel (nickel-chromium steel), carbon, glass and comparable materials.

The substrate may be of a planar or linear shape or may also be a textile sheet fabric, such as a woven fabric, a knitted fabric or knitwear. Even a non-woven is possible.

The method described above may be applied several times for generating a plurality of superposed layers. In this case, it is possible to add doping agents to the aerosol or the fluid to produce a p-conducting or an n-conducting semiconductor layer.

To generate the crystal nuclei, the base material may correspondingly be finely ground in a ball mill.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

The following description of the figures explains aspects for the understanding of the invention. The person skilled in the art may, as usual, derive further details from the drawings which are not described and which add to the figure description in this respect. It is to be understood that a number of modifications are possible. The skilled person may easily effect the precise dimensioning empirically based on the given information.

Figure 1:
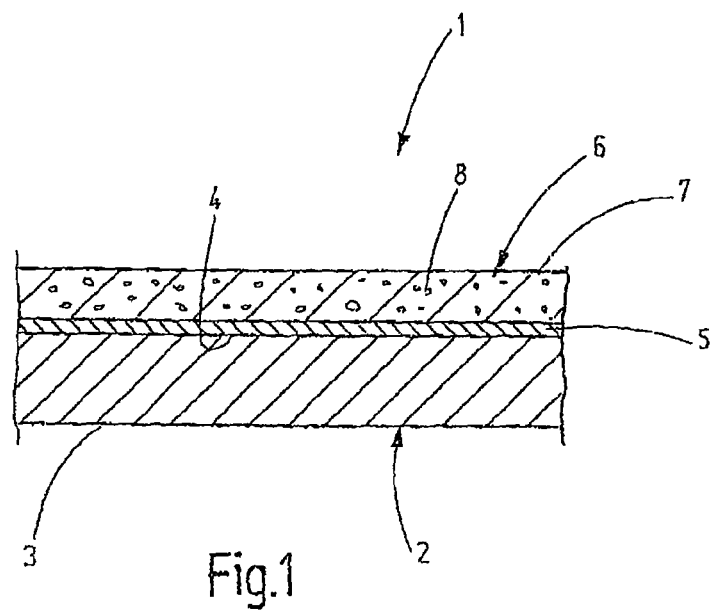
FIG. 1 is a highly schematic, fragmentary cross-sectional view showing the structure of an embodiment of the invention with the component having only one single semiconductor layer.

FIG. 1 shows a section of an inventive semiconductor component in a highly schematized representation. The semiconductor component 1 comprises a strip-shaped and thus endless substrate 2. The substrate 2 may be made of a metallically conducting material having sufficient temperature stability, for instance nickel-chromium steel. The strip-shaped substrate 2 is delimited by two flat sides (surfaces) 3 and 4 extending in parallel and spaced from each other. On the flat side 4, a diffusion barrier layer 5 (of a thickness of about 200 nm) in the form of a molybdenum layer is for example provided. The layer of molybdenum is electrically conducting so as not to prevent electrical contact to the substrate 2.

A thin semiconducting layer 6 is provided on the molybdenum layer 5. The semiconducting layer 6 is made of polycrystalline silicon 7 (of a thickness of about 30 μm to 100 μm), in which crystal nuclei 8 are embedded in a diffuse and uniform distribution. The crystal nuclei 8 provide for the applied silicon, which is for example atomically released from a silicon donor such as silane, to crystallize around the crystal nuclei 8 in a polycrystalline form.

Due to the crystal nuclei which are diffusely distributed, the crystallization process proceeds in a comparatively fast manner, since there are many surfaces on which the crystallization starts.

The crystal nuclei 8, which are made of the same base material as the semiconductor layer itself, have no influence on the subsequent semiconductor properties.

The production method is described further below on the basis of FIG. 5.

Instead of the substrate of stainless steel, a substrate of carbon film, glass or another film of sufficient temperature stability may also be used. If a film is used which is not electrically conducting, a metallically conducting layer may be inserted between the diffusion barrier layer 5 and the substrate 2. This metallically conducting layer having a thickness of about 500 nm may be produced on the substrate 2 by any known method. The application of the metallic layer is not a subject of the present invention and therefore does not need a detailed explanation here. If there are no concerns about diffusion, the diffusion barrier layer may also be omitted.

Figure 2:
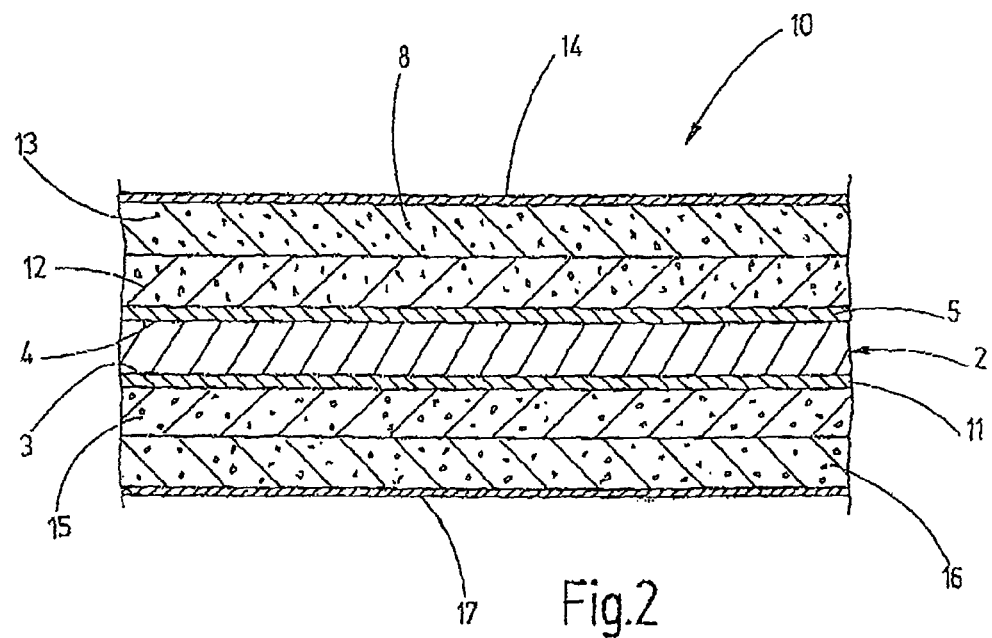
FIG. 2 is a fragmentary cross-sectional view showing another embodiment of the invention with the component having two photodiode structures on both sides of the substrate.

FIG. 2 shows a multilayer semiconductor component in the form of a multilayer planar photodiode/photoelement, such as used for producing current from sunlight. The semiconductor component referenced 10 as a whole in turn comprises the strip-shaped substrate 2 consisting of nickel-chromium steel. On the side 4, a molybdenum layer 5 is provided as a diffusion barrier layer as described above. A further diffusion barrier layer 11 is provided on the opposite flat side 3. On the flat side of the diffusion barrier layer 5 facing away from the substrate 2, a first semiconductor layer 12, for example doped to be n-conducting, is provided and includes crystal nuclei 8 contained therein. A p-conducting semiconductor layer 13, which in turn likewise contains a plurality of homogeneously distributed crystal nuclei 8, is applied to the n-conducting semiconductor layer 12.

On the side of the semiconductor layer 13 facing away from the substrate 2, a thin metallic layer 14 is provided, which has the function of an electrode for the photodiode formed of the two layers 12 and 13.

On the side facing downward in FIG. 2, a similar structure is provided consisting of an n-conducting semiconductor layer 15 resting directly on the diffusion barrier layer 11, and a p-conducting semiconductor layer 16. The downward termination in turn forms a metallically conducting layer 17 serving as an electrode for the lower planar photodiode. The other electrode for the two photodiodes is jointly formed by the substrate 2.

Due to this doping, the anode in the semiconductor component 10 is formed by the layer 13 and the cathode by the layer 12 on the one side, and on the other side the anode is formed by the layer 16 and the cathode by the layer 15. Thus, when illuminated by light, the positive terminal of the voltage source forms at the anode, and the negative terminal at the layer 8 and hence at the substrate 2.

Figure 3:
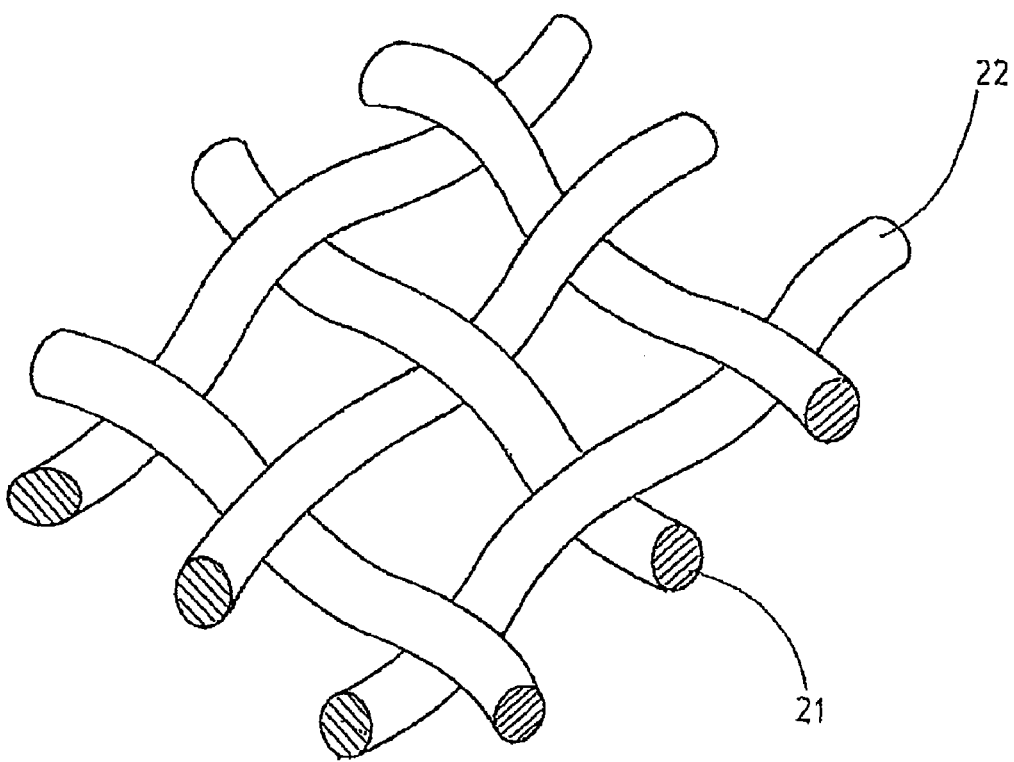
FIG. 3 is a perspective view of one example of a substrate made of a textile sheet material.

The inventive semiconductor component 1 or 10, is illustrated on the basis of a film-shaped substrate 2 in the form of the thin stainless steel sheet or a carbon film. Glass, hence silicon oxide with the corresponding loading agents is possible as a further material for the substrate 2. Apart from film-shaped components, other planar structures may also be used, such as fabrics of correspondingly temperature-stable materials. A section of such a fabric is shown in FIG. 3. The fabric shows a plain weave and consists of warp threads and weft threads 21, 22.

Figure 4:
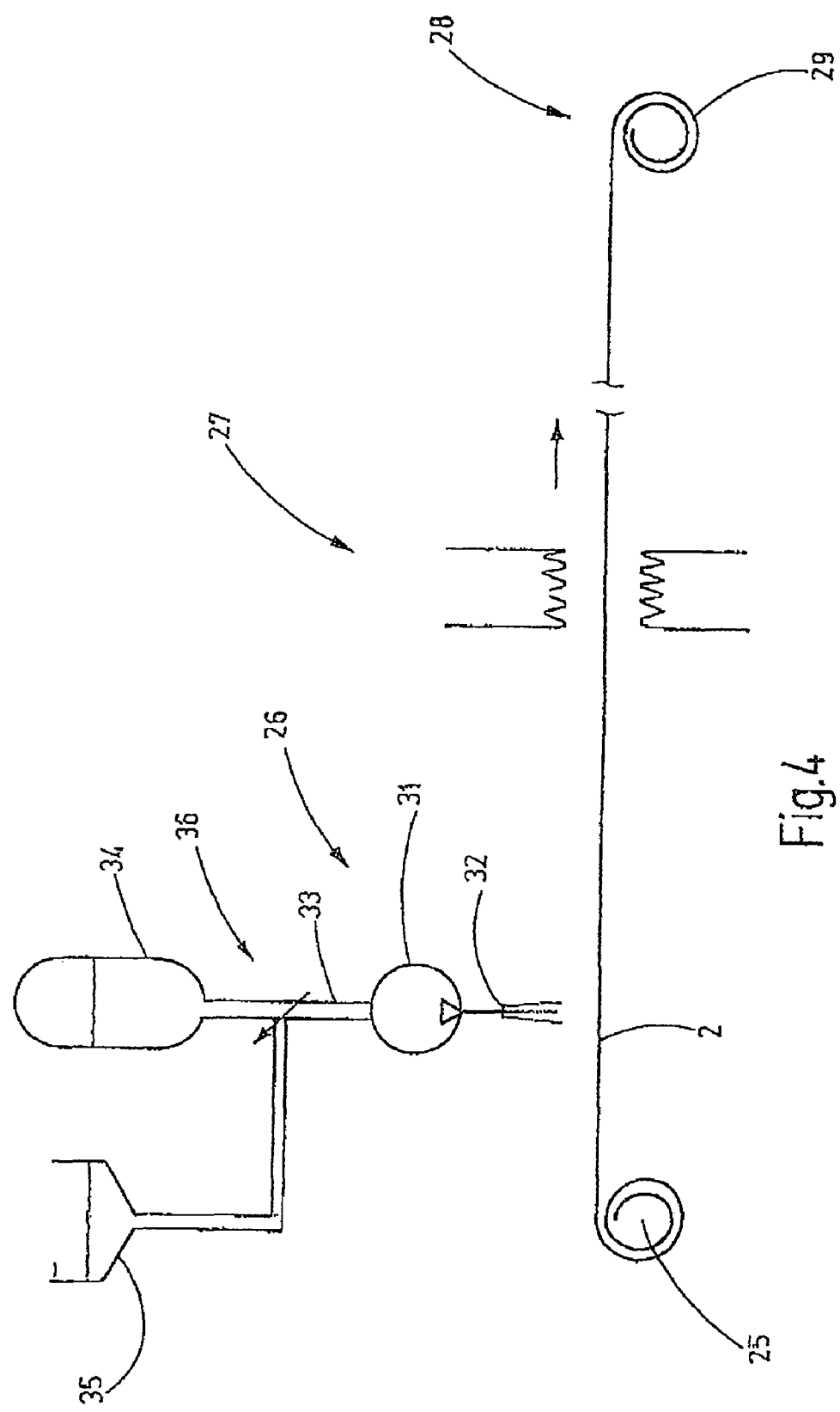
FIG. 4 is a highly schematic diagram of an installation for carrying out the method according to one embodiment of the invention for obtaining the inventive component.

The production method for the semiconductor elements according to FIGS. 1 and 2 is shown in FIG. 4 in a highly schematized manner. The substrate 2, for example already provided with a diffusion barrier layer 5 on both sides, is wound on a storage roll 25. From here, the substrate 2 first runs through a spraying station 26 and subsequently through a heating station 27 before being wound up again into a roll 29 at 28.

The spraying station 26 is shown in a highly schematized manner and includes a pump 31, the pressure or outlet side of which is connected to a spray nozzle 32. At the inlet side, the pump 31 is in communication with a fluid reservoir 34 and a powder container 35 via a line system 33. The chemical compound in question as a donor for the semiconductor material is located within the fluid reservoir 34. This can be liquid silane or liquid germane, for example.

The crystal nuclei are contained in the powder container 35 in the form of a corresponding powder. Suitable crystal nuclei are finely ground silicon or germanium. The powder may be produced from pure silicon or pure germanium in ball mills, as known to the person skilled in the art.

The powder coming from the container 35 is admixed in a corresponding dosage to the silane or germane flowing past from the reservoir 34 at a controllable mixing station 36. The contained mixture of fluid and solid matter powder reaches the pump 31 and is sprayed through the nozzle 32 onto the upper side of the substrate provided with the diffusion barrier layer 5. Due to the size ratios, the already existing diffusion barrier layer is not visible in FIG. 4.

The suspension sprayed on forms a thin fluid layer having a homogenous thickness on the upward-facing side of the coated substrate 2.

Since the strip runs at a constant speed from the roll 25 to the roll 29, corresponding to the direction of the illustrated part, the entire length of the substrate 2 is sprayed consecutively on the respective side with the suspension.

After the suspension has been applied to the substrate 2, or the free side of the substrate which has been correspondingly coated beforehand, the respective length portion of the substrate 2 arrives in the heating station 27. The area of the substrate 2 passing through having the suspension thereon is heated in the heating station to a temperature above 800° C. and below 900° C. A thermal dissociation of the silane or germane takes place at this temperature. The chemically bound silicon or germanium is released while the residual components evaporate. Due to the crystal nuclei contained therein, in the form of the ground semiconductor powder from the container 35, a crystallization starts immediately around the crystal nuclei 8, so that the originally liquid suspension layer converts into a polycrystalline semiconductor layer.

The accompanying evaporation process of the volatile components from the silane or germane does not affect the crystallization, nor does it result in defects in the layer.

After completion of the crystallization and sufficient cooling of the substrate 2 with the semiconductor layer contained thereon, the substrate 2 is continuously wound up again at 28 into roll 29.

A substrate 2 is obtained after the first inventive step which contains a semiconductor layer on the processed side above the diffusion barrier layer. The thickness of the semiconductor layer may be varied within wide limits through the thickness of the suspension layer. The latter is in turn dependent on the droplet size, the spray volume and the passing speed of the substrate 2 in front of the nozzle 32.

After the first semiconductor layer has been applied in the manner described, the obtained roll 29 may be brought to the left side of the arrangement and may form a new roll 25 with a substrate already bearing a first semiconductor layer. The above described coating process with the suspension and the subsequent crystallization in the heating station 27 is passed through a second time. Hereby the substrate which now passes through the spraying station 26 and already bears the diffusion barrier layer as well as the first semiconductor layer corresponding to the semiconductor layer 12 from the illustration of FIG. 2, is provided with a further suspension layer which is applied in the heating station 27 as described above, so as to convert to polycrystalline in a semiconductor layer according to the semiconductor layer 13 as per FIG. 2. After the second pass, the roll 29 contains a substrate 2 on which the diffusion barrier layer 5, the semiconductor layer 12 and the semiconductor layer 13 are present.

The described processes may also be conducted in the same manner multiple times with the opposite side of the substrate 2 facing downward as shown in FIG. 4, so that a strip-shaped structure is ultimately formed which is provided with two semiconductor layers stacked one upon the other on both sides.

In an alternative embodiment, all of the process steps which produce the four semiconductor layers may also be performed one after the other, with the strand only being wound up thereafter. At the end, the strip-shaped strand already bears all of the semiconductor layers 12, 13, 15 and 16 before the final spooling.

The spray application of the suspension and the heating in the heating station 27 is in each case performed in a protective gas atmosphere and at normal pressure. Problematic sealings are not required, and it is also not necessary to likewise carry out the winding and unwinding process in a protective gas atmosphere, although this can be expedient to protect the semiconductor layer.

A doping agent is required to generate the different types of conductivity to the semiconductor layers. These doping agents are gallium and arsenic in photodiodes or photoelements. A p-conducting layer is produced by gallium, and an n-conducting layer is produced by arsenic. These substances may either be supplied to the mixing station 36 separately from their own containers, or they may already be admixed with the silane 34, or may be contained in powder form in the container 35 with the crystal nuclei.

The number of the semiconductor layers which can be stacked upon each other in the described manner is not limited. It is also possible to generate the produced semiconductor layer without doping atoms and to subsequently produce the respective type of conductivity after polycrystallization by ion implantation.

The described method is not limited to the use of either silane or germane. Rather, any mixture of germane and silane may be used in the method in order to obtain a mixed crystal layer of germanium and silicon. The mixing ratio is arbitrary and depends on the desired electrical properties. Also in the mixture of silane and germane, the crystal nuclei are silicon or germanium or a mixture of both elements.

Finally, it is conceivable to produce three-layered structures for transistors on the substrate which are later, using known methods, separated from each other and contacted so as to create a large-surface thin film transistor structure. A further structure which is possible consists in combining a transistor structure with a light-emitting diode structure to obtain so-called TFT components.

It is likewise conceivable to use this structure to create two-dimensional light-emitting semiconductor elements.

A semiconductor element comprises a substrate and at least one semiconductor layer realized to be polycrystalline on one side of the substrate. The polycrystalline semiconductor layer contains the crystal nuclei.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A semiconductor component comprising a substrate having a surface and at least one polycrystalline layer of a semiconductor material on at least a part of the surface, wherein the polycrystalline layer contains a plurality of diffusely distributed crystal nuclei and is formed by a process comprising applying a suspension composed of the crystal nuclei and a fluid selected from the group consisting of liquids and gases to form a fluid layer of the suspension and thermally treating the fluid layer of the suspension after application thereof, and wherein the substrate comprises a textile sheet fabric.

2. The semiconductor component according to claim 1, wherein the substrate comprises a material that is dimensionally stable at temperatures of between 800° C. and 900° C.

3. The semiconductor component according to claim 1, further comprising a diffusion barrier layer between the substrate and an immediately adjacent polycrystalline layer of the semiconductor material.

4. The semiconductor component according to claim 3, wherein the diffusion barrier layer comprises molybdenum.

5. The semiconductor component according to claim 1, wherein the polycrystalline layer of semiconductor material contains silicon or germanium or a mixture of silicon and germanium.

6. The semiconductor component according to claim 1, wherein the polycrystalline layer of semiconductor material is doped to be p-conducting or n-conducting.

7. The semiconductor component according to claim 1, wherein the crystal nuclei comprise the same material as the polycrystalline semiconductor layer itself.

8. The semiconductor component according to claim 1, wherein the crystal nuclei comprise a different semiconductor material than the polycrystalline layer itself.

9. The semiconductor component according to claim 1, wherein the crystal nuclei are germanium or silicon particles.

10. The semiconductor component according to claim 1, wherein the crystal nuclei have a particle size between 100 nm and 10,000 nm, optionally between 500 nm and 2000 nm, or optionally between 700 nm and 1400 nm.

11. The semiconductor component according to claim 1, wherein the component comprises at least two polycrystalline layers of semiconductor material stacked upon each other and having different types of conductivity.

12. The semiconductor component according to claim 1, wherein a side of the semiconductor layer facing away from the substrate and farthest from the substrate is provided with a light-transmitting, electrically conducting layer having no semiconductor properties.

13. The semiconductor component according to claim 1, wherein the substrate is planar and comprises two flat sides, wherein both flat sides are provided with at least one polycrystalline layer of semiconductor material, and the polycrystalline layers contain diffusely distributed crystal nuclei.

14. The semiconductor component according to claim 1, wherein the crystal nuclei have a density which is homogenous over an extent of the polycrystalline layer of semiconductor material.

15. A method for producing a semiconductor component according to claim 1, comprising applying a suspension to the substrate, the suspension comprising crystal nuclei and a fluid having a liquid or gas form, which keeps the semiconductor material chemically bound, and after application of the suspension to the substrate thermally treating the thus-formed layer in order to obtain the polycrystalline layer.

16. The method according to claim 15, wherein the fluid is a silane or germane or a mixture of silane and germane.

17. The method according to claim 15, wherein the crystal nuclei have a particle size of between 100 nm and 10,000 nm, optionally between 500 nm and 2000 nm, or optionally between 700 nm and 1400 nm.

18. The method according to claim 15, wherein the crystal nuclei are selected from silicon and germanium.

19. The method according to claim 15, wherein the substrate comprises a material which remains dimensionally stable at the crystallization temperature.

20. The method according to claim 15, wherein the substrate has a planar or linear shape.

21. The method according to claim 15, which is repeated at least a second time in order to apply a further polycrystalline layer.

22. The method according to claim 15, wherein the crystal nuclei are produced from a material which is ground in a ball mill.

* * * * *